United States Patent
Li et al.

(10) Patent No.: US 7,399,428 B2
(45) Date of Patent: Jul. 15, 2008

(54) COMPOSITIONS COMPRISING HIGH LIGHT-OUTPUT YELLOW PHOSPHORS AND THEIR METHODS OF PREPARATION

(75) Inventors: Yi-Qun Li, Walnut Creek, CA (US); Shifan Cheng, Moraga, CA (US); Ning Wang, Martinez, CA (US); Yi Dong, Tracy, CA (US); Xiao-Dong Sun, Fremont, CA (US)

(73) Assignee: Intematix Corporation, Fremont, CA (US)

( * ) Notice: Subject to any disclaimer, the term of this patent is extended or adjusted under 35 U.S.C. 154(b) by 0 days.

(21) Appl. No.: 11/061,979

(22) Filed: Feb. 18, 2005

(65) Prior Publication Data

US 2006/0022170 A1   Feb. 2, 2006

Related U.S. Application Data

(60) Provisional application No. 60/545,551, filed on Feb. 18, 2004.

(51) Int. Cl.
    *C09K 11/82*   (2006.01)
(52) U.S. Cl. .............................. 252/301.4 R; 117/948; 117/13; 117/19
(58) Field of Classification Search .......... 252/301.4 R; 117/948, 13, 19
    See application file for complete search history.

(56) References Cited

U.S. PATENT DOCUMENTS 3,667,901 A   6/1972   Krylov et al.
4,041,319 A   8/1977   Fukuzawa et al.
6,013,199 A * 1/2000   McFarland et al. .... 252/301.4 R

FOREIGN PATENT DOCUMENTS

GB   1128512   * 9/1968

OTHER PUBLICATIONS

Agunaou et al, "Effect of the Gd substitution by Bi in the BixGd1–xVO4 catalysts on the catalytic behaviour of methanol oxidation", Applied Catalysis A:General, vol. 196, Issue 1, Mar. 27, 2000, pp. 87-92.*

* cited by examiner

*Primary Examiner*—C. Melissa Koslow
(74) *Attorney, Agent, or Firm*—Buchanan, Ingersoll & Rooney LLP (57) ABSTRACT

Embodiments of the present invention are directed to compositions and processing methods of rare-earth vanadate based materials that have high emission efficiency in a wavelength range of 480 to 700 nm with the maximum intensity at 535 nm (bright yellow) under UV, X-ray and other forms of high-energy irradiation. Embodiments of the present invention are directed to general chemical compositions of the form $(Gd_{1-x}A_x)(V_{1-y}B_y)(O_{4-z}C_z)$, where A is selected from the group consisting of Bi, Tl, Y, La, Ce, Pr, Nd, Pm, Sm, Eu, Tb, Dy, Ho, Er, Tm, Yb, and Lu for $0<x<0.2$; B is Ta, Nb, W, and Mo for $0<y<0.1$; and C is N, F, Br, and I for $0<z<0.1$. Methods of preparation include sol gel, liquid flux, and co-precipitation processes.

3 Claims, 9 Drawing Sheets

COMPOSITIONS COMPRISING HIGH LIGHT-OUTPUT YELLOW PHOSPHORS AND THEIR METHODS OF PREPARATION

CROSS REFERENCE TO RELATED APPLICATIONS

This application claims priority to U.S. Provisional Patent Application No. 60/545,551, filed Feb. 18, 2004, which is incorporated herein by reference in its entirety.

BACKGROUND OF THE INVENTION

1. Field of the Invention

Embodiments of the present invention are directed to compositions and processing methods of rare-earth vanadate based materials that have high emission efficiency in a wavelength range of 480 to 700 nm with the maximum intensity at 535 nm (bright yellow) under UV, X-ray and other high-energy irradiation. The materials of the invention can be used in a form selected from the group consisting of bulk, sheet, film, ceramic, single crystal, glass, and composite forms.

2. State of the Art

Luminescent materials play an important role in applications for color television, energy-saving fluorescent lamps, LEDs and other display-systems and devices. These phosphors are characterized by light output (energy-conversion efficiency), color, thermal stability, response time, decay time. Scintillators are phosphors that show luminescence under X-ray radiation. They are commonly used in today's X-ray imaging detectors for medical diagnostics, security inspection, industrial non-destructive evaluation (NDE), dosimetry, and high-energy physics.

Recently, there has been an increasing demand for transparent, high atomic density, high speed and high light-output scintillator crystals and ceramic materials as detectors for computed X-ray tomography. Many transparent ceramics such as $(Y,Gd)_2O_3:Eu^{3+}$, $Gd_2O_2S:Pr,F,Ce$ have recently been developed for this purpose. However their slow response and lack of single crystal form have limited their applications for X-ray Explosive Detection systems and X-ray panel displays.

The currently used scintillators for X-ray Explosive Detection system are mainly CsI and $CdWO_4$ single crystals. Even though CsI exhibits a high light output, $CdWO_4$ crystals are more popular for X-ray Explosive Detection due to slow scan speed associated with afterglow problem for CsI. As listed in Table 1, low light output is a disadvantage for $CdWO_4$.

Bismuth as a tri-valent primary activator in $YVO_4$ is known to have high emission efficiency, exhibiting broad-band luminescence, and is also known to improve emission when europium is used as a sensitizer if co-doped in ppm levels. Bismuth substituted vanadates exhibit superior advantages in that they display short luminescence decay times of a few μs in comparison to the rare earth elements (such as $Eu^{3+}$, $Nd^{3+}$, $Tb^{3+}$ doped scintillators) which have decay times on the order of about 1 ms. Scintillators with bismuth as an activator are contemplated in this disclosure to be ideal materials of choice as detectors in X-ray tomography. Though bismuth has desirable qualities, it has the disadvantage of evaporating easily at high temperatures in the process of making such phosphors, and thus deviations of stoichiometry that leads to the fluctuation in properties results. Therefore, it is critical to develop a process to maintain the bismuth concentration at desired levels during the material synthesis. Embodiments of the present invention are directed to novel bismuth containing phosphors, as well as methods of their preparation.

SUMMARY OF THE INVENTION

The present embodiments provide a group of bismuth doped gadolinium vanadates in which the emission intensity excited by X-ray is higher than prior commercially available scintillator compounds such as $CdWO_4$. The emission peak position of the present materials is red-shifted compared to CsI:Tl and $CdWO_4$ scintillators that are currently being used. The decay time of the present materials is contemplated to be much shorter than that for $Gd_2O_2S:Pr,Ce$. Several processing methods are disclosed for synthesizing a single phase of a solid solution of $(GdBi)VO_4$ based compound with accurately determined stoichiometry.

The general chemical composition of this group of metal oxides is $(Gd_{1-x}A_x)(V_{1-y}By)(O_{4-z}C_z)$, where A is selected from the group consisting of Bi, Tl, Pb, Y, La, Ce, Pr, Nd, Pm, Sm, Eu, Tb, Dy, Ho, Er, Tm, Yb, and Lu for $0<x<0.2$, B is Ta, Nb, W, Mo for $0<y<0.1$, and C is N, F, Br, and I for $0<z<0.1$.

Applications of the present oxide materials include X-ray detectors, X-ray CT, digital panel imaging, and screen intensifiers. The materials of the invention can be used in a form selected from the group consisting of bulk, sheet, film, ceramic, single crystal, glass, and composite forms.

BRIEF DESCRIPTION OF THE DRAWINGS

This invention will be further described with reference being made to the accompanying drawings, in which.

TABLE 1

The characters of the X-ray scintillators currently used in ESD and Panel Display

| X-ray Scintillators for FPD | Density | Emiss. wavelength (nm) | Rel. light output (%) | After glow (%@ 50 ms) | Radiation Damage (%) | Toxicity | Stability |
|---|---|---|---|---|---|---|---|
| CsI:Tl | 4.5 | 550 | 100 | 0.3 | +13.5 | Tl: toxic | Moisture sensitive |
| $CdWO_4$ | 7.9 | 530 | ~30 | $<3 \times 10^{-6}$ | −2.9 | Toxic | Stable |
| $Gd_2O_2S:Pr, Ce$ | 7.34 | 550–650 | ~60 | <0.01 | <−3.0 | Corrosive | Stable |

DETAILED DESCRIPTION OF THE INVENTION

Embodiments of the present invention are directed to general chemical compositions of the form:

$$(Gd_{1-x}A_x)(V_{1-y}B_y)(O_{4-z}C_z)$$

where A is selected from the group consisting of Bi, Tl, Y, La, Ce, Pr, Nd, Pm, Sm, Eu, Tb, Dy, Ho, Er, Tm, Yb, and Lu for 0<x<0.2; B is Ta, Nb, W, and Mo for 0<y<0.1; and C is N, F, Br, and I for 0<z<0.1.

The novel scintillator materials with fast response times, high density, high energy efficiencies are contemplated to have diverse applications in several areas such as security (such as airport) inspections, medical diagnosis (including x-ray computed tomography, or CT) and PET (positron emission tomography), well-logging, industrial non-destructive evaluation (NDE), and physics and chemistry research.

Pure $GdVO_4$ has a broad-band emission peak at around 435 nm at a temperature below 300K with a maximum output intensity at 100K. Embodiments of the present invention include: 1) substitution of oxygen by fluorine, nitrogen, and bromine; 2) substitution of gadolinium by bismuth, thallium, and remaining elements of the rare-earth family; and 3) substitution of vanadium by tantalum, niobium, tungsten, and molybdenum for the enhancement of the scintillating properties of $GdVO_4$ materials.

Figure 1:
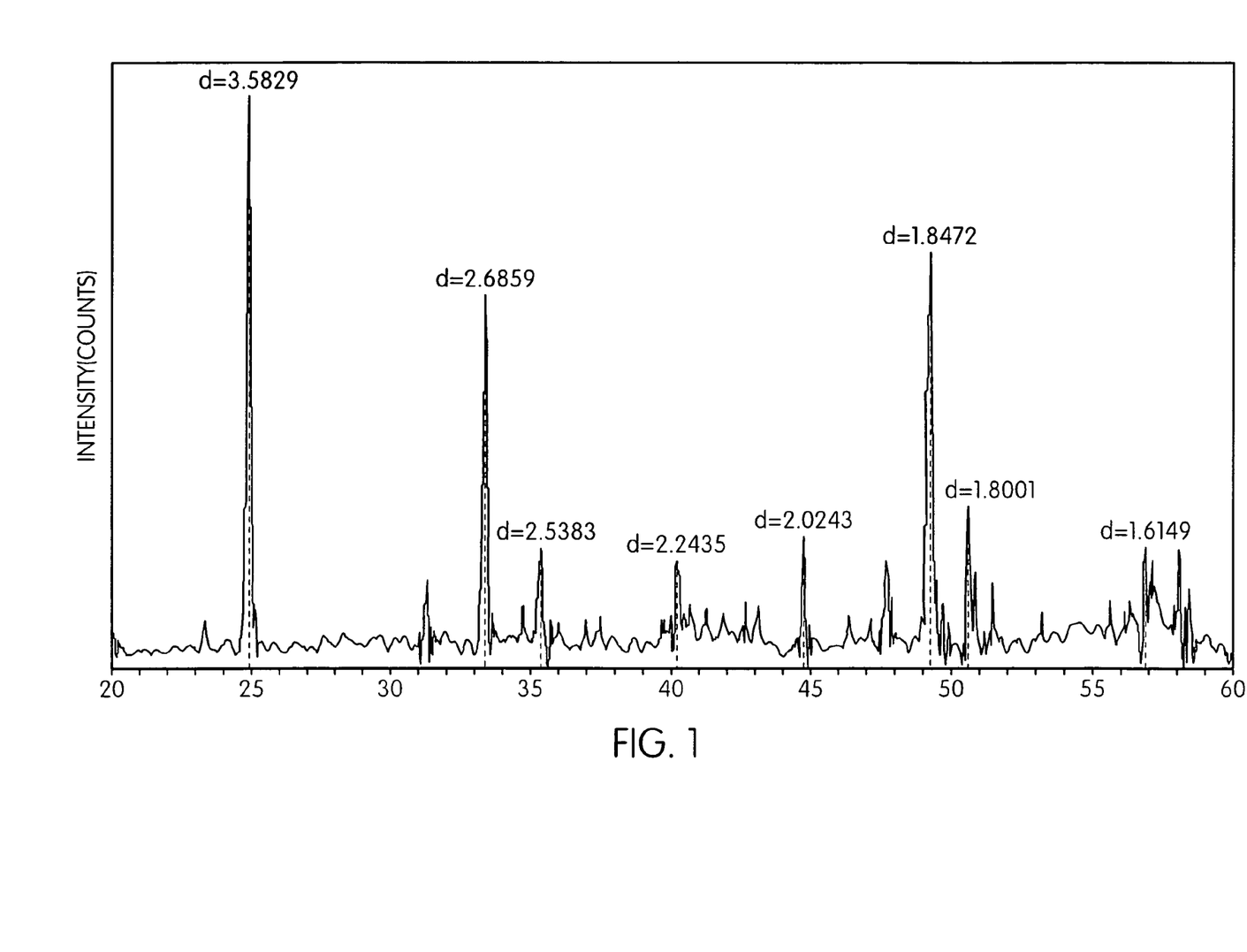
FIG. 1 is an X-ray diffraction pattern of $(Gd_{0.99}Bi_{0.01})VO_4$ prepared by co-precipitation and calcining at 1100° C. for 10 hours.

These substituted $GdVO_4$ materials were prepared by three methods including a sol-gel process, a liquid flux process, and a co-precipitation process. Typical X-ray diffraction patterns showed in FIG. 1 are representative of the crystal structure of the inventive modified $GdVO_4$ materials. Sol-gel, liquid flux, and co-precipitation methods include a calcining and/or sintering crystallization step to produce a substantially single crystalline material, and as known in the art, crystals in the Czochralski method are pulled from the melt.

Sol-gel Process

Sol-gel methods of producing powder forms of $GdV(O_{4-z}F_z)$, where 0.001<z<0.1, may be described by the following process:

1. Desired amounts of $VF_4$ and $Gd(NO_3)_3$ were dissolved in de-ionized water. Two monomers, acrylamid and N,N'-methylene bis-acrylamide were dissolved in water in a 1:20 ratio. The initiator and catalyst comprised ammonium bisulphate and N,N,N',N'-tetramethylethylenediamine respectively.
2. Monomers are then added to the solution of a mixture of $VF_4$ and $Gd(NO_3)_3$ solutions in a ratio of about 1:2;
3. Initiator and catalyst are then added to the mixed solution under continuous stirring at 60° C. for 10 minutes until the solution became a gel;
4. The gel is calcined between 600~800° C. for 2 hours in 5~10° C./min heating and cooling rate to decompose the monomer, initiator and nitrates;
5. After cooling and grinding, the solid is then finally calcined at 1000~1200° C. for 2~10 hours.

Figure 2:
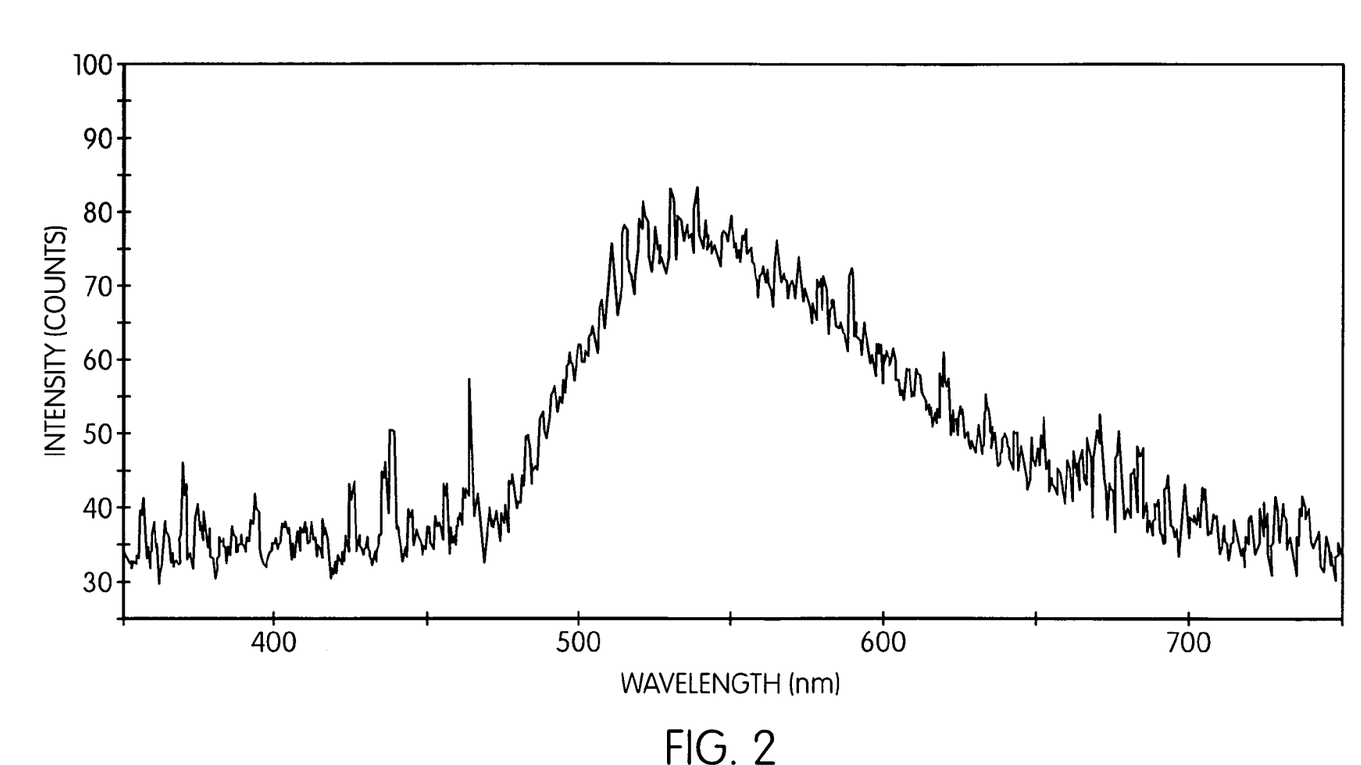
FIG. 2 is a plot of an emission spectrum of $GdV(OF)_4$ excited by X-ray radiation having a peak energy of about 8 keV from a copper anode at a power of about 40 kV and 20 mA.

The emission spectrum of calcined $GdV(OF)_4$ are shown in FIG. 2, which has a broad band emission spectrum peaked at 530 nm. In this method, the calcining process, such as time, temperature and heating rate are used to control the F ion concentration. Since $VF_4$ can react with oxygen to form $VOF_3$, $V_2O_5$ and $F_2$ in high temperature.

Liquid Flux Process

Liquid flux methods for producing the powder materials $(Gd_{1-x}Bi_x)V_{1-y}N_yO_4$ (where 0.001<x<0.1, 0.001<y<0.2), $(Gd_{1-x}Bi_x)V(O_{4-z}F_z)$(where 0.001<x<0.1, 0.001<z<0.2) and $(Gd_{1-x}Bi_x)V_{1-y}N_yO_{4-z}F_z$ (where 0.001<x<0.1, 0.001<y<0.1, 0.001<z<0.1) are described by the following process (showing that in some circumstances, N may substitute for V instead of O):

1. Raw chemicals for preparing these samples are $GdO_3$, $V_2O_5$, $VF_3$, $VOF_3$, VN and $Bi_2O_3$. The mixture of LiCl and KCl in a 1:1 molar ratio is used as the flux;
2. The $GdO_3$, $V_2O_5$, $VF_3$, $VOF_3$, VN and $Bi_2O_3$ were mixed in desired weight ratios. The flux was then blended with the mixture;
3. The mixed powders are then calcined and melted at about 400 to 700° C. for about 10 hours;
4. The calcined solid is washed with de-ionized water about 4 to 5 times to wash off the flux;
5. The remaining solid was washed in $HNO_3$ and then in ammonia to remove impurities; and
6. After drying and grinding, the solid was then finally calcined at about 800 to 1500° C. for about 5 to 10 hours.

The $GdVO_4$ based compounds are formed at 400~700° C. with the assistance of a liquid flux. The formation temperature is much lower than convenient method, especially for doping of nitrogen and halide elements. Also, the calcining temperature around 800° C. is much lower than other methods.

Figure 3:
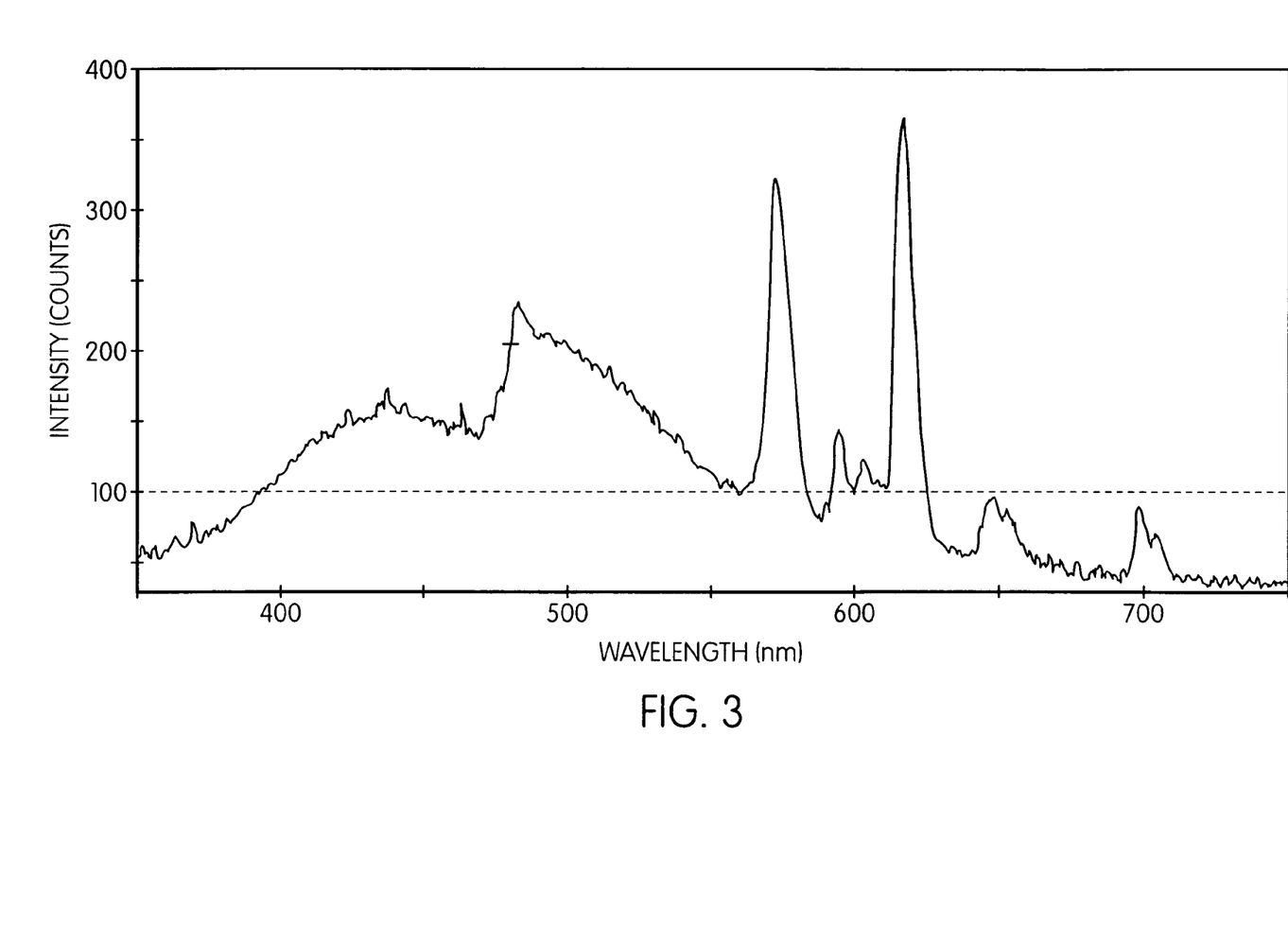
FIG. 3 is a plot of an emission spectrum of $GdV(ON)_4$ excited by X-ray radiation having a peak energy of about 8 keV from a copper anode at a power of about 40 kV and 20 mA.

FIG. 3 shows the emission intensity of N substituted $Gd_{0.95}Bi_{0.05}VO_4N_{4-x}$ as a function of wavelength. It is found that the peaks of Dy and Eu appear in high intensity. From the chemical analysis of $Gd_2O_3$, there are less than 100 ppm Dy and Eu contained in the composition. The N content can intensify the Dy and Eu emission efficiency significantly.

Figure 4:
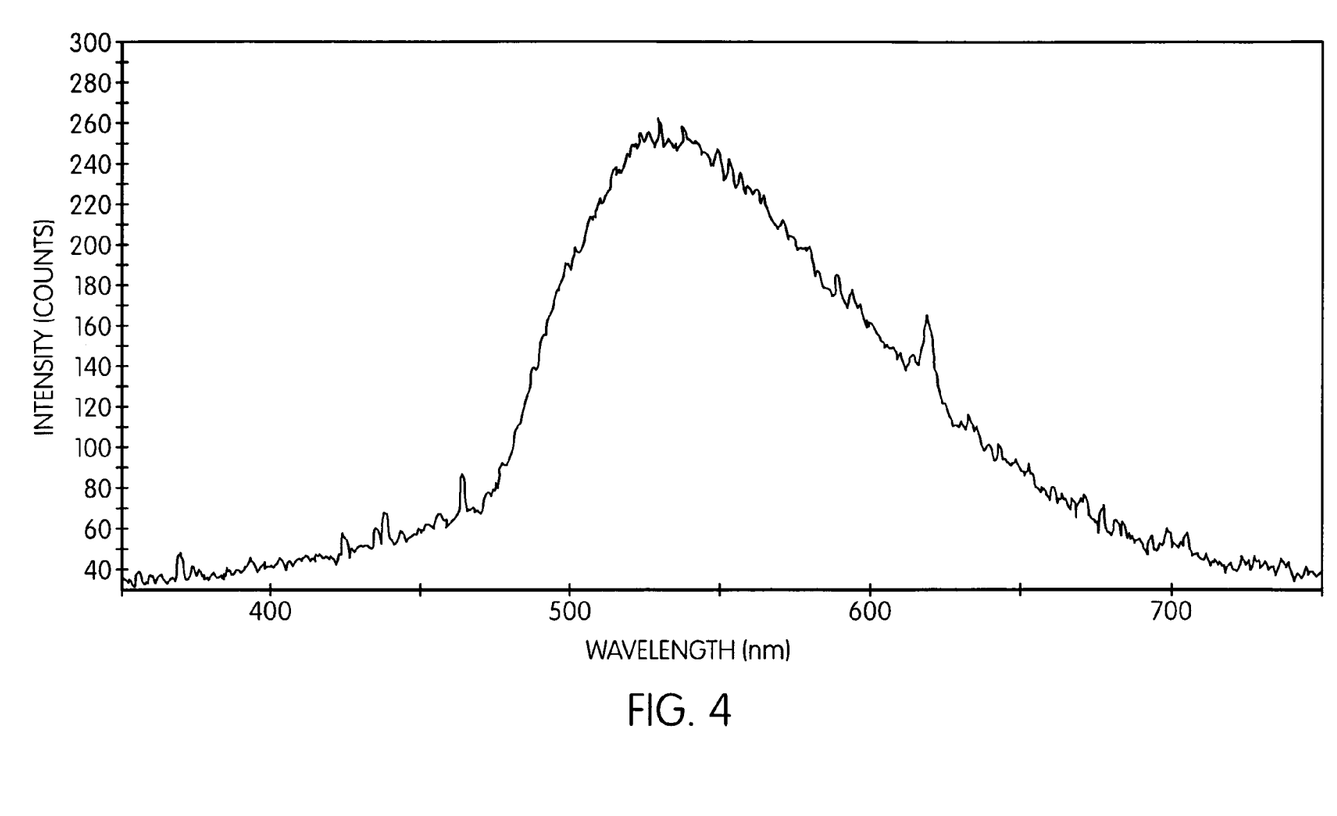
FIG. 4 is a plot of an emission spectrum of $(Gd_{0.98}Tl_{0.02})VO_4$ excited by X-ray radiation having a peak energy of about 8 keV from a copper anode at power of about 40 kV and 20 mA.
Figure 5:
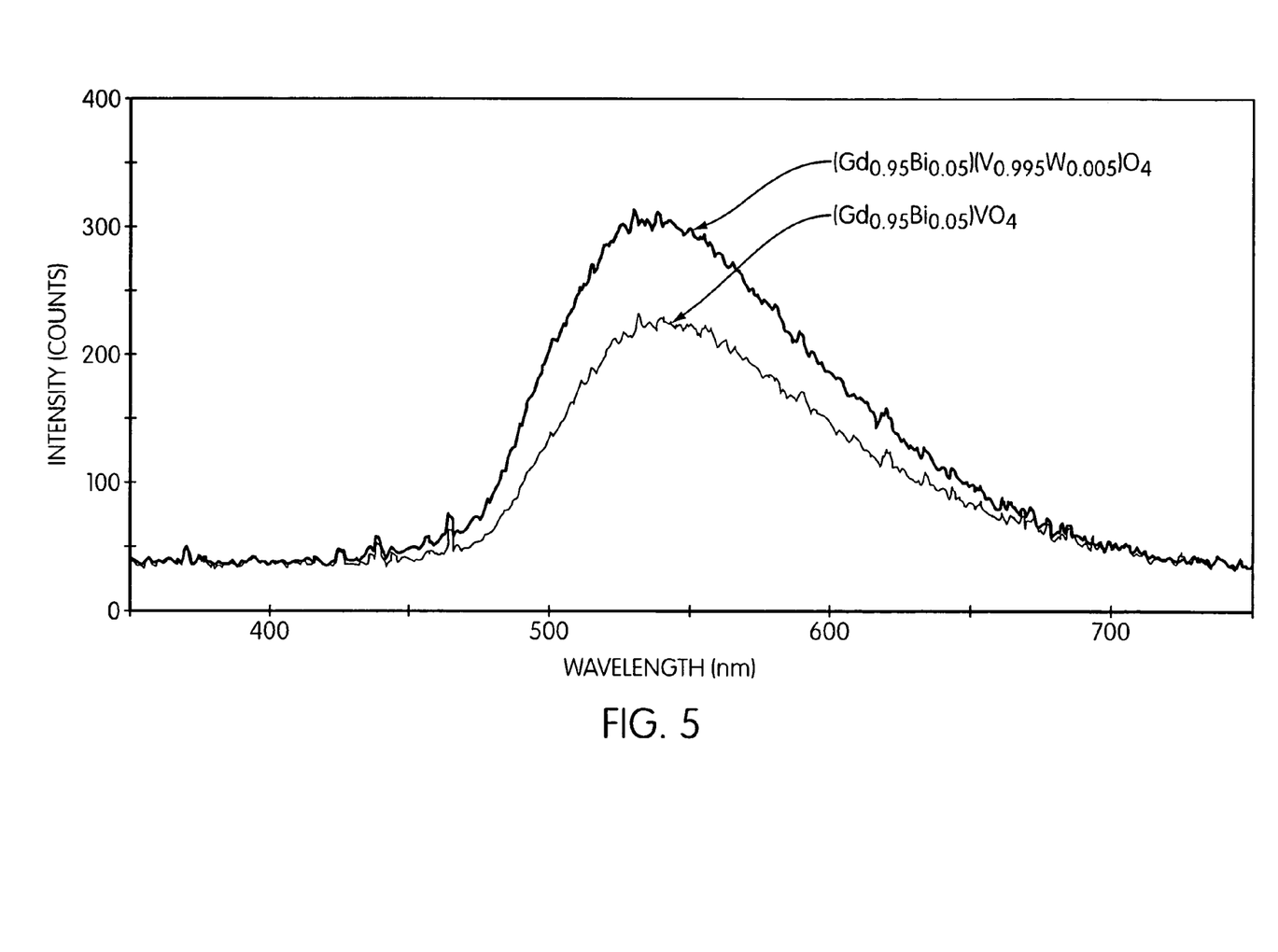
FIG. 5 is a plot of an emission spectrum of $(Gd_{0.95}Bi_{0.05})(V_{0.995}W_{0.005})O_4$ excited by X-ray radiation having a peak energy of about 8 keV from a copper anode at a power of about 40 kV and 20 mA.

The method was applied to prepare $(Gd_{0.98}Tl_{0.02})VO_4$ compound by mixing 2% $Tl_2O_3$ in substitution of $Gd_2O_3$. FIG. 4 shows the emission spectra of $(Gd_{0.98}Tl_{0.02})VO_4$, the peak intensity is located at 535 nm. This method was also used to prepare a $(Gd_{0.95}Bi_{0.05})(V_{0.995}W_{0.005})O_4$ compound by mixing 0.5% $WO_3$ in substitution of $V_2O_5$. FIG. 5 shows the emission spectra of $(Gd_{0.95}Bi_{0.05})(V_{0.995}W_{0.005})O_4$, the peak intensity is located at 535 nm.

Co-precipitation Method

A co-precipitation method for producing the powder material $(Gd_{1-x}Bi_x)VO_4$ (where 0.001<x<0.1) was carried out using the following exemplary procedure:

1. a) $Gd(NO_3)_3$ and $Bi(NO_3)_3$ in a desired ratio was dissolved in de-ionized water.
    b) Corresponding amount of $NH_4VO_3$ was dissolved in de-ionized water to prepare another solution;
2. The mixed $Gd(NO_3)_3$ and $Bi(NO_3)_3$ solution was added to the $NH_4VO_3$ solution. In the process of precipitation, the pH is adjusted to 9 by ammonia, followed by saturation under continuous stirring at 60° C. for 2 hours;
3. After drying, the resulting solid was calcined at 300° C. for 60 minutes to decompose the $NH_4NO_3$.
4. After cooling and grinding, the solid was finally sintered at 800 to 1100° C. for 10 hours.

Figure 6:
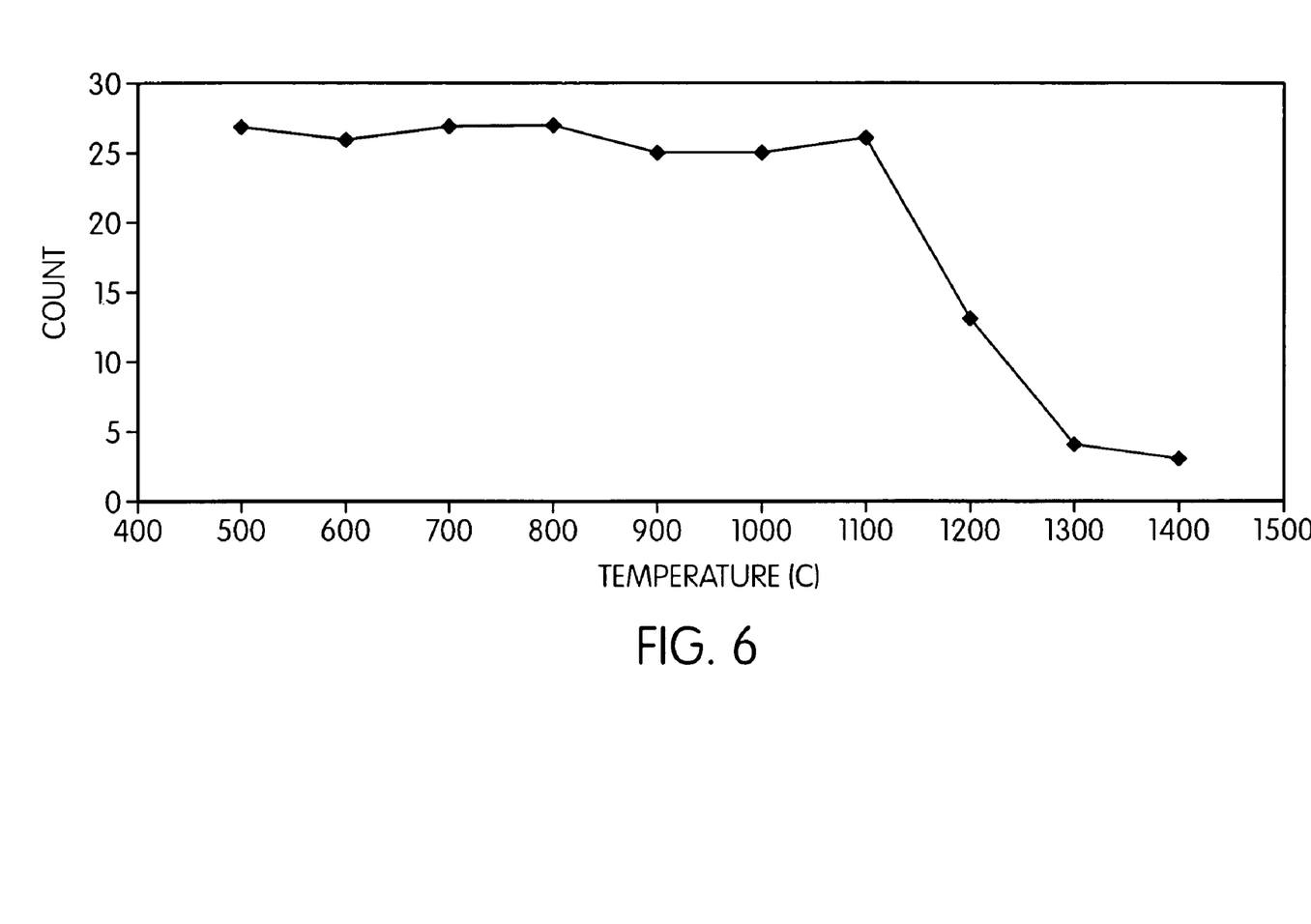
FIG. 6 is a graph of Bi concentration (as determined by an X-ray fluorescence signal) plotted as a function of calcining temperature for samples of $Gd_{0.9}Bi_{0.1}VO_4$ prepared by co-precipitation method.
Figure 7:
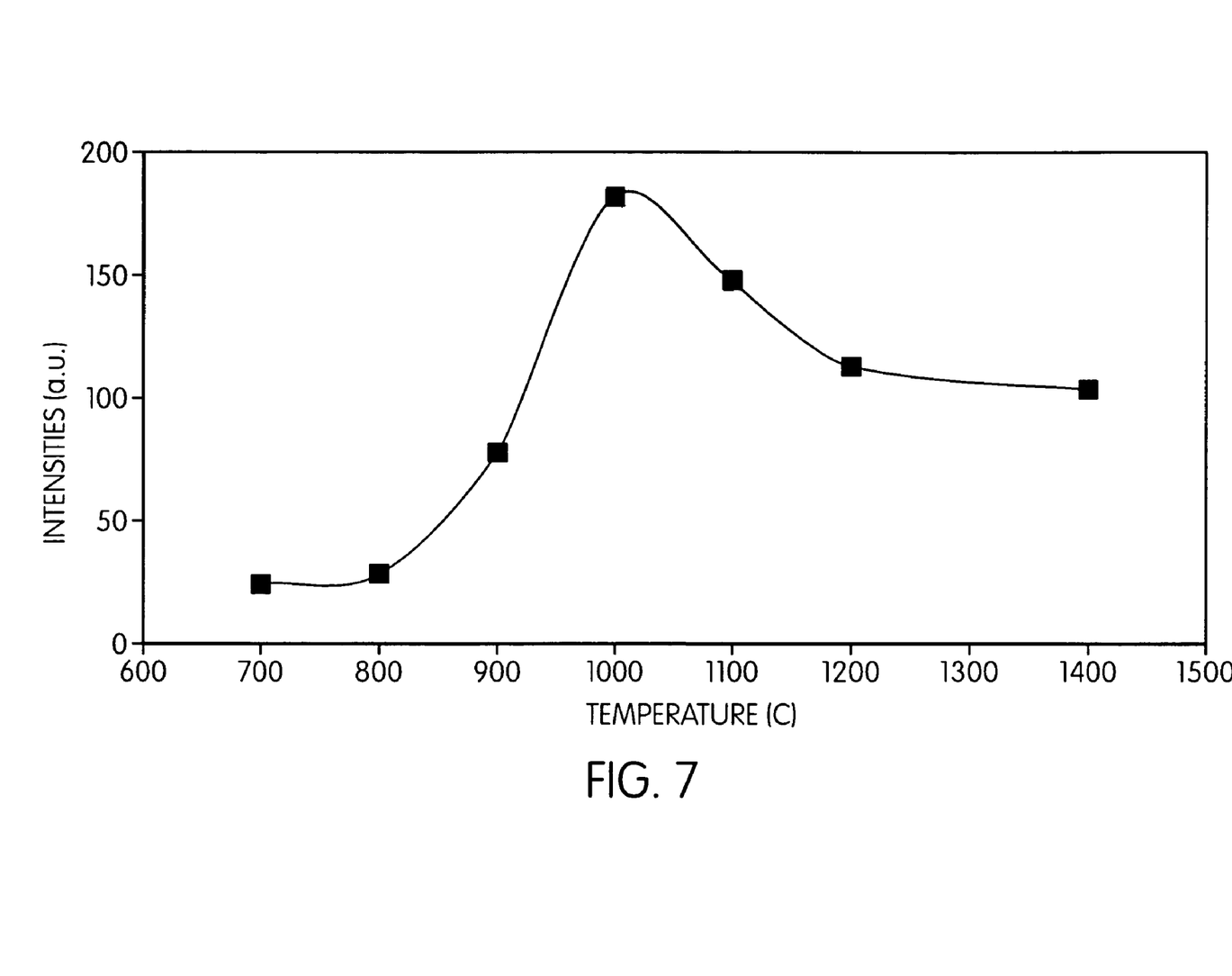
FIG. 7 is a graph of an emission intensity of $Gd_{0.9}Bi_{0.1}VO_4$ excited by X-ray radiation having a peak energy of about 8 keV from a copper anode at power of about 40 kV and 20 mA, plotted as a function of the calcining temperature.

The advantage of this precipitation method is to form a stoichiometry solid solution of $BiVO_4$—$GdVO_4$ at temperature below 300° C. Since $GdVO_4$ has a melting point of 1800° C. the bismuth substituted compounds are relatively stable in the followed high temperature calcining process. $Bi_2O_3$ and $V_2O_5$ are low melting and high volatility materials, which causes great difficulty for preparing stoichiometric materials with the conventional ceramic processing through solid reaction and sintering. FIG. 6 shows that the Bi concentration maintains unchanged until 1100° C. for a 10% Bi—$GdVO_4$ sample. The starting temperature for the evaporation of Bi from the Bi—$GdVO_4$ compound depends on the Bi concentration. The lower the Bi concentration is, the higher temperature is for starting to lose Bi. Samples with different bismuth concentrations show their highest emission intensity at different calcining temperatures. The peak emission intensity for a series of $Gd_{0.9}Bi_{0.1}VO_4$ samples calined at different temperatures are plotted in FIG. 7.

Figure 8:
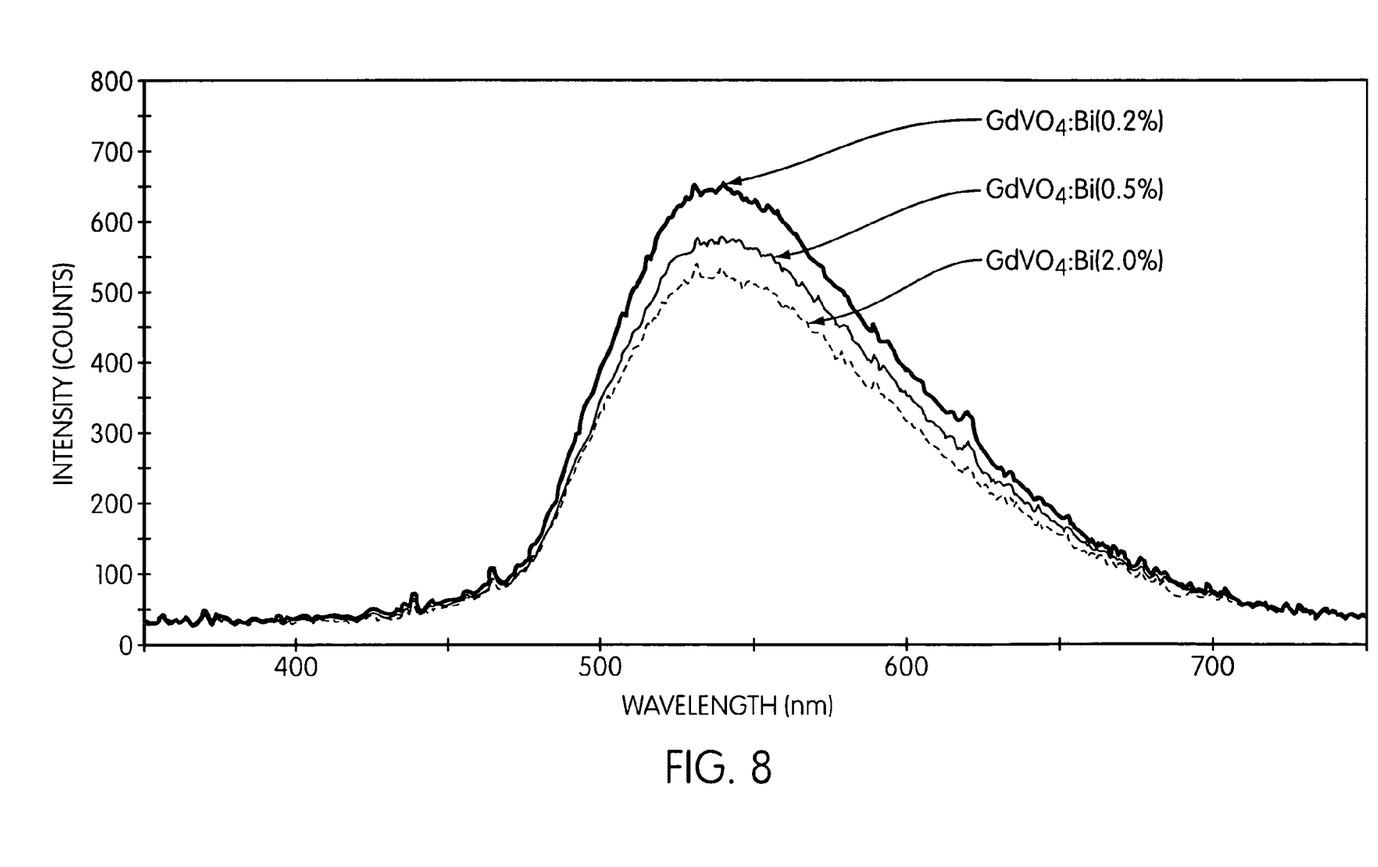
FIG. 8 is a graph of the emission spectrum of $(Gd_{1-x}Bi_x)VO_4$ (x=0.2%, 0.5%, 2%) excited by X-ray radiation having a peak energy of about 8 keV from a copper anode at a power of about 40 kV and 20 mA.

A series of samples with different Bi concentrations were prepared by the exemplay co-precipitation methods described above, and the effect of Bi concentration in $(Gd_{1-x}Bi_x)VO_4$ on emission is displayed in FIG. 8. One skilled in the art will note that as the Bi concentration increases, the peak intensity decreases.

Figure 9:
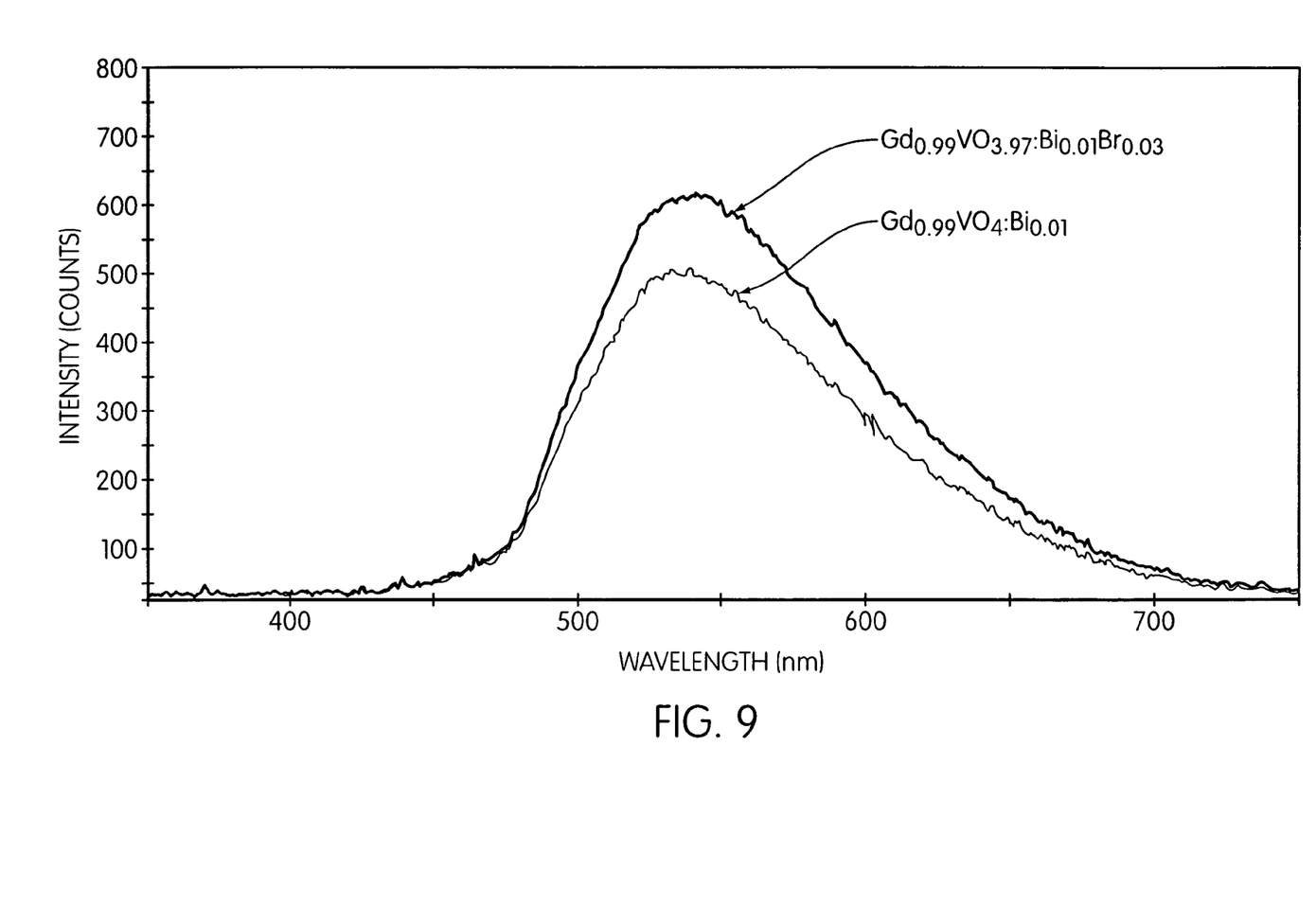
FIG. 9 is a graph of the emission spectrum of $(Gd_{0.99}Bi_{0.01})VO_{3.97}Br_{0.03}$ and $(Gd_{0.99}Bi_{0.01})VO_4$ excited by X-ray radiation having a peak energy of about 8 keV from a copper anode at a power of about 40 kV and 20 mA.

This method was also used to prepare $(Gd_{0.99}Bi_{0.01})VO_{3.97}Br_{0.03}$ compounds by mixing $VBr_3$ into the starting solution. FIG. 9 shows how Br doping can significantly improve the emission intensity from 500 to more than 600.

Czochralski Method

In an alternative embodiment, a Czochralski method for producing substantially single crystal materials $(Gd_{1-x}Bi_x)VO_4$ may be used where $0.001<x<0.1$, wherein the method comprises the steps of:
  a) mixing $Gd_2O_3$, $Bi_2O_3$, $V_2O_5$ and flux ($NaVO_4$ or $2PbO$—$V_2O_5$ or $V_2O_5$ in a desired ratio to prepare a batch;
  b) melting the batch in an Ir crucible and the melting temperature is from 700 to 1100° C.;
  c) arranging the rotation rate of the pulling rod in the range of 1-100 rpm, and the pulling rate from 1 to 10 mm per hour;
  d) annealing the single crystal in air atmosphere.

What is claimed is:
1. A liquid flux method for producing powder materials selected from the group consisting of $(Gd_{1-x}Bi_x)V_{1-y}N_yO_4$ where $0.001<x<0.1$ and $0.001<y<0.2$;
$(Gd_{1-x}Bi_x)V(O_{4-z}F_z)$ where $0.001<x<0.1$, $0.001<z<0.2$; and
$(Gd_{1-x}Bi_x)V_{1-y}N_yO_{4-z}F_z$ where $0.001<x<0.1$, $0.001<y<0.1$, $0.001<z<0.1$; wherein the method comprises the steps of:
  a) mixing $Gd_2O_3$, $V_2O_5$, $VF_3$, $VOF_3$, VN, and $Bi_2O_3$ in desired weight ratios;
  b) blending a flux of LiCl and KCl in a 1:1 molar ratio with the mixture from step a);
  c) calcining and melting the mixed powders from step b) at about 400 to 700° C. for about 10 hours;
  d) washing the calcined material from step c) with deionized water to remove the flux;
  e) washing the resulting mixture from step d) in nitric acid, and then ammonia, to remove impurities;
  f) drying and grinding the material from step e); and
  g) calcining the material from step f) at about 800 to 1500° C. for about 5 to 10 hours.

2. A co-precipitation method for producing the powder material $(Gd_{1-x}Bi_x)VO_4$ where $0.001<x<0.1$, wherein method comprises the steps of:
  a) mixing $Gd(NO_3)_3$ and $Bi(NO_3)_3$ in a desired ratio to prepare a solution in de-ionized water;
  b) dissolving a corresponding amount of $NH_4VO_3$ in water to prepare another solution;
  c) adding the mixed $Gd(NO_3)_3$ and $Bi(NO_3)_3$ solution from step a) to the $NH_4VO_3$ solution from step b);
  d) adjusting the pH of the combined solutions from step c) to 9 while stirring continuously at 600° C. for 2 hours; and
  e) calcining the resulting solid from step d) at 300° C. for 60 minutes.

3. A Czochralski method for producing substantially single crystal materials $(Gd_{1-x}Bi_x)VO_4$ where $0.001<x<0.1$, wherein the method comprises the steps of:
  a) mixing $Gd_2O_3$, $Bi_2O_3$, $V_2O_5$ and flux ($NaVO_4$ or $2PbO$—$V_2O_5$) in a desired ratio to prepare a batch;
  b) melting the batch in an Ir crucible and the melting temperature is from 700 to 1100° C.;
  c) arranging the rotation rate of the pulling rod in the range of 1-100 rpm, and the pulling rate from 1 to 10 mm per hour;
  d) annealing the single crystal in air atmosphere.

* * * * *